(12) United States Patent
Bruland et al.

(10) Patent No.: US 6,181,131 B1
(45) Date of Patent: Jan. 30, 2001

(54) MAGNETIC RESONANCE FORCE MICROSCOPY WITH OSCILLATOR ACTUATION

(75) Inventors: Kelly Bruland, Seattle; William M. Dougherty, Bothell; Joseph L. Garbini; John Sidles, both of Seattle, all of WA (US)

(73) Assignee: University of Washington, Seattle, WA (US)

(*) Notice: Under 35 U.S.C. 154(b), the term of this patent shall be extended for 0 days.

(21) Appl. No.: 09/122,401

(22) Filed: Jul. 24, 1998

Related U.S. Application Data
(60) Provisional application No. 60/053,853, filed on Jul. 25, 1997.

(51) Int. Cl.[7] ............................................. G01V 3/00
(52) U.S. Cl. ......................... 324/300; 324/307; 324/310; 73/105
(58) Field of Search .............................. 324/300, 307, 324/309, 310; 73/105

(56) References Cited

U.S. PATENT DOCUMENTS

| | | | |
|---|---|---|---|
| 5,166,615 | 11/1992 | Sidles | 324/307 |
| 5,266,896 | 11/1993 | Rugar et al. | 324/307 |
| 5,513,518 | 5/1996 | Lindsay | 73/105 |
| 5,515,719 | 5/1996 | Lindsay | 73/105 |
| 5,612,491 | 3/1997 | Lindsay | 73/105 |
| 5,619,139 | 4/1997 | Hulczer et al. | 324/318 |

OTHER PUBLICATIONS

Albrecht, T.R. et al. (1991), "Frequency modulation detection using high–Q cantilevers for enhanced force microscope sensitivity," J. Appl. Phys. 69(2):668–673.

Bruland, K.J. et al., "Optimal control of force microscope cantilevers. II. Magnetic coupling implementation," (Aug. 1996) J. Appl. Phys. 80(4):1959–1964.

(List continued on next page.)

*Primary Examiner*—Christine Oda
*Assistant Examiner*—Brij B. Shrivastav
(74) *Attorney, Agent, or Firm*—Greenlee, Winner and Sullivan, P.C.

(57) ABSTRACT

The present invention provides a magnetic resonance force microscopy apparatus and method for use in combination with an oscillator. The oscillator has a motional body and one member of a sample/magnet pair is disposed on the motional body. The present invention actuates the motional body. The apparatus comprises a holder adapted to mount the second member of a sample/magnet pair, an RF field generator positioned to apply a field to the sample, a motion sensor adapted to be coupled with the motional body, an actuator adapted to be coupled with the motional body, and a motion controller coupled with the actuator and with the motion sensor. The actuation effort can dampen the vibrational amplitude of the oscillator that would otherwise diminish the spatial resolution of the device; control the oscillator dynamical properties to allow more stable signal detection; vary the distance between the magnetic tip and the sample material for sample scanning and field modulation; apply actuation and control signals to help prevent the oscillator from contacting and sticking to the sample material or other device components; provide a method for calibrating instrument subsystems; provide a way for controlling all oscillator vibrational modes, including torsional modes; and provide a way to apply feedback control to the oscillator, thereby gaining dynamic advantages.

38 Claims, 6 Drawing Sheets

OTHER PUBLICATIONS

Garbini, J.L. et al., "Optimal control of force microscope cantilevers. I. Controller design," (Aug. 1996) *J. Appl. Phys.* 80(4):1951–1958.

Hansma, P.K. et al., "Tapping mode atomic force microscopy in liquids," (Mar. 1994) *Appl. Phys. Lett.* 64(13):1738–1740.

Hobbs, P.C.D. et al., "Magnetic force microscopy with 25 nm resolution," (Nov. 1989) *Appl. Phys. Lett.* 55(22):2357–2359.

Lantz, M.A. et al., "Force microscopy imaging in liquids using ac techniques," (1994) *Appl. Phys. Lett.* 65(4):409–411.

Liu, C.H. et al., "High–Bandwidth Feedback Control of Micromachined Tunneling Sensors," Proceedings of ASME Dynamic Systems and Control Division, DSC–vol. 57–2 (1995 IMECE), 1001–1010.

Mertz, J. et al., "Regulation of a microcantilever response by force feedback," (1993) *Appl. Phys. Lett.* 62(19):2344–2346.

Rugar, D. et al., "Force detection of nuclear magnetic resonance," (Jun. 1994) *Science* 264:1560–1563.

Rugar, D. and Grütter, P., "Mechanical parametric amplification and thermomechanical noise squeezing,"(Aug. 1991) *Am. Phys. Soc.* 67(6):699–702.

Rugar, Daniel and Hansma, Paul, "Atomic Force Microscopy," (Oct. 1990) *Physics Today* 23–30.

Sarid, Dror and Elings, Virgil, "Review of scanning force microscopy," (1991), *J. Vac. Sci. Technol. B* 9(2):431–437.

Service, Robt. F., "An attactive new way to pin an ID on atoms," (Jun. 1994), *Science* 264:1532.

Sidles et al., "The theory of oscillator–coupled magnetic resonance with potential applications to molecular imaging" (Aug. 1992) *Review of Scientific Instruments*, 63:3881–3899.

Sidles et al., "Magnetic resonance force microscopy"(Jan. 1995) *Reviews of Modern Physics*, vol. 67, pp. 249–265.

Wago, K. et al., "Force–detected electron–spin resonance: Adiabatic inversion, nutation, and spin echo," (Jan. 1998) *J. Phys. Review B* 57(2):1108–.

Wago, K. et al., "Low–temperature magnetic resonance force detection," (Mar./Apr. 1996) *J. Vac. Sci. Technol. B* 14(2):1197–1201.

O. Züger et al., "Three–dimensional imaging with a nuclear magnetic resonance force microscope," (Feb. 1996) *J. Appl. Phys.* 79(4):1881–1884.

Züger, O. and Rugar, D., "Magnetic resonance detection and imaging using force microscope techniques (invited)," (May 1994) *J. Appl. Phys.* 75(10):6211–6216.

MAGNETIC RESONANCE FORCE MICROSCOPY WITH OSCILLATOR ACTUATION

CROSS-REFERENCE TO RELATED APPLICATIONS

This application claims the benefit of priority from United States Provisional Patent Application Serial #60/053,853 filed Jul. 25, 1997.

STATEMENT REGARDING FEDERALLY SPONSORED RESEARCH OR DEVELOPMENT

This invention was made with government support under contract #5-RO1-RR08820 awarded by the National Institute of Health and contract #BIR-9318002 awarded by the National Science Foundation. The government has certain rights in the invention.

BACKGROUND OF THE INVENTION

Magnetic resonance force microscopy (MRFM) is a variant of scanning probe microscopy that combines the sensitivity and spatial resolution of atomic force microscopy with the three-dimensional and nondestructive imaging capabilities of magnetic resonance imaging. Sample imaging entails mechanically detecting the interaction between sample spins as they undergo magnetic resonance with a nearby gradient magnet. Magnetic resonance phenomena can be detected and imaged by mounting either the sample or the gradient source on a mechanical oscillator and sensing changes in oscillator motion that are induced by magnetic resonance.

Sidles first conceived of the theory of magnetic resonance force microscopy, with potential application as a molecular imaging technology, in the early 1990's. The theory and potential applications of MRFM imaging are described in several early articles (for example, Sidles et al., "The theory of oscillator-coupled magnetic resonance with potential applications to molecular imaging" Review of Scientific Instruments, vol. 63, pp. 3881–3899 (August 1992)). A review article broadly describing magnetic resonance force microscopy was published after further theoretical development and experimental demonstration of the concept of MRFM imaging (Sidles et al., "Magnetic resonance force microscopy" Reviews of Modem Physics, vol. 67, pp. 249–265 (January, 1995)).

Three US patents have also been issued in the field. In U.S. Pat. No. 5,166,615, Sidles discloses a method for mechanically detecting magnetic resonance. A modulation technique patented by Rugar et al. in U.S. Pat. No. 5,266,896 provides a means for creating signals that are easier to detect. In U.S. Pat. No. 5,619,139, Holezer et al. describes an MRFM device in which a spin at the tip of the gradient magnet undergoes magnetic resonance while in atomic interaction with sample spins, thereby scanning sample surfaces.

In force detected magnetic resonance, the basis for magnetic resonance force microscopy, there is a magnetic force between the sample material and the magnetic tip. If either the sample material or the magnetic tip are affixed to a mechanical oscillator, magnetic resonance in the sample can cause a fluctuating force between the sample and the tip that produces detectable changes in oscillator motion. The oscillator is typically a cantilever supported at the base.

In MRFM devices, the inhomogeneous magnetic field B produced by the magnetic tip serves several purposes. The gradient of this field helps to produce the signal force F(t)

$$F(t) = \int\int_v\int \nabla(M \cdot B)dv$$

where M and v are the magnetization and volume of the sample material. In addition, the magnetic field produced by the magnetic tip alters the magnetic polarization field of the sample material. The inhomogeneity in polarization field enables the generation of magnetic resonance in a portion of the sample, providing the spatial resolution necessary to image sample features.

More lengthy descriptions of mechanically detected magnetic resonance and magnetic resonance force microscopy are contained in the references previously cited, notably the patents, the Sidles Review of Scientific Instruments article, and the Sidles Reviews of Modern Physics article.

The use of oscillators with a low spring constant (soft oscillators) and high resonant quality (low intrinsic damping) is preferable for MRFM experiments because these oscillators offer force sensitivity advantages. However, oscillators with a low spring constant and low intrinsic damping have disadvantages as well. Some of the problems encountered with the use of soft oscillators are:

(a) The inherent thermal energy in the oscillators causes vibrations that are often the dominant source of experimental noise. The noise resulting from thermal energy hinders the creation of the MRFM signals and decreases the image resolution of the device.

(b) The MRFM signals are difficult to detect because of the dynamical properties associated with a high resonant quality including long damping time and narrow response bandwidth.

(c) Sample scanning and modulation of the sample polarization field are ineffective with oscillators with low spring constant because the distance between the source of field gradient and the sample of interest cannot be effectively varied.

(d) The oscillator can contact and stick to the sample or other device components because of the motion of soft oscillators.

(e) MRFM instrument subsystems cannot be effectively calibrated when soft oscillators are used.

Previous researchers have attempted to actuate soft cantilevers using a base displacement method. This method is not very effective because the low intrinsic spring constant of the cantilever decouples the motion of the tip from the motion of the base and therefore, all the linear displacement modes of the oscillator or the torsional modes of the oscillator cannot be effectively actuated and controlled. In addition, actuation by base displacement cannot provide a means for collocated feedback control of the oscillator, a technique involving the application of control effort to the oscillator near the location where motion is measured. Collocated feedback control offers dynamic advantages that cannot be exploited by base actuation.

Also, previous methods of detecting magnetic resonance use an analog implementation of feedback controller dynamics. Such analog controllers are difficult to configure and adjust. Furthermore, these analog implementations do not adapt to changing feedback requirements.

Numerous problems in MRFM have remained unsolved, including spurious oscillator vibrations that diminish the spatial resolution of the device, unstable signal detection due to oscillator dynamical properties, contacting and sticking of the oscillator to the sample material or other device components ("snap-in"), and the lack of a method for calibrating instrument subsystems.

SUMMARY OF THE INVENTION

This invention provides oscillator actuation and control in devices that mechanically detect magnetic resonance for modifying the natural dynamic properties of the oscillator, and controlling oscillator motion to track a reference signal. Actuation and control are achieved by the application of actuation effort directly to the oscillator at a location that undergoes oscillatory motion. A number of beneficial changes in oscillator motion can result from selecting and implementing an appropriate motion controller. Three of the most important ways that feedback control can alter oscillator motion are in damping the vibration amplitude of the oscillator, modifying the natural dynamic properties of the oscillator, and controlling oscillator motion to track a reference signal. Additional benefits include reducing spurious oscillator vibrations, enhancing the spatial resolution of the images, aiding in signal production and preventing "snap-in".

The present invention is a magnetic resonance force microscopy apparatus for use in combination with an oscillator. The oscillator has a motional body and one member of a sample/magnet pair disposed on the motional body. The apparatus comprises a sample/magnet holder adapted to mount the second member of a sample/magnet pair, a radio-frequency (RF) field generator positioned to apply a RF field to the sample, a motion sensor adapted to be coupled with the motional body, an actuator adapted to be coupled with the motional body, and a motion controller coupled with the actuator and with the motion sensor. The motion controller is responsive to signals it receives and uses the actuator to control the motional body of the oscillator. Reference signals are optionally included in the input of the motion controller. One of the central ideas in the present invention is that it is advantageous to apply actuation effort directly to the motional body of the oscillator, rather than actuating by indirectly deflecting the base of the oscillator.

The term "magnet" as used herein, refers to any material responsive to changes in a magnetic field. A preferred embodiment has a permanent magnet positioned on the motional body. Alternatively, the magnet is positioned on the sample/magnet holder. In a preferred embodiment, the RF fields are generated by a coil, the magnetic actuation field is generated by a solenoid, the motion controller is a digital motion controller and the motion sensor is a fiber-optic system. Preferred actuators are magnetic, electrical, optical, thermal, piezoelectric, magnetostrictive and mechanical. In other preferred embodiments, the magnetic field generator produces a magnetic field substantially parallel to the motional body. "Substantially parallel" refers to a magnetic field having the largest component in the parallel direction.

The term "radio-frequency (RF) field" as used herein, refers to any frequency in the radio spectrum. Radio-frequency fields of differing frequencies are useful for different magnetic resonance force microscopy applications.

The present invention also provides a method of oscillator actuation in a magnetic resonance force microscopy system having an oscillator that has a motional body. The motional body moves in response to magnetic resonance in a sample. The method of oscillator actuation consists of inducing magnetic resonance in a sample, detecting the motion of the motional body, and applying actuation effort to the motional body of the oscillator. One favorable aspect of the method of oscillator actuation is the prevention of sticking of the oscillator to another member of the magnetic resonance force microscopy system. Another favorable aspect of the method of oscillator actuation is the ability to vary the sample polarization field by adjusting the oscillator position, and thus the spacing between the sample and the magnet in the sample/magnet pair. Variations in this polarization field can be used to scan different portions of the sample or to modulate the polarization field to aid in signal generation.

The magnetic resonance force microscopy system can be calibrated in response to application and detection of periodic motion of the oscillator. Preferably, the sample is not undergoing magnetic resonance while calibration is being performed.

Oscillators with a low spring constant are desirable for the mechanical detection of magnetic resonance because they have a lower thermal noise floor. For a simple cantilever oscillator the uncontrolled root-mean-square (rms) Brownian amplitude of oscillator vibrations is $$x_{tip}^{rms} = \left(\frac{k_B T}{k}\right)^{\frac{1}{2}} \quad \text{Eq. 1}$$

where $x_{tip}$ is cantilever displacement, k is cantilever spring constant, $k_B$ is Boltzmann's constant and T is absolute temperature. Brownian motion is experimentally indistinguishable from the kinetic effects of a Langevin force applied to the cantilever tip having spectral density $$S_w = \frac{2kk_B T}{Q\omega_n} \quad \text{Eqn. 2}$$

with $\omega_n$ being the cantilever resonant frequency and Q the resonant quality.

It is more important to apply actuation and feedback control to soft oscillators because they have a larger thermal amplitude and a greater propensity to "snap-in" and stick to experimental components as discussed above. Actuation and control by the application of effort to the motional body of the oscillators is applicable to all oscillators and offers a number of additional advantages.

The difference between actuation by the application of forces to the motional body of the oscillator and displacement of the base of the oscillator is illustrated by the transfer function $G_b(s)$ relating tip displacement of a cantilever oscillator $X(s)$ to base displacement $X_b(s)$ $$G_b(s) = \frac{X(s)}{X_b(s)} = k\left(\frac{s}{Q\omega_n} + 1\right)G(s) \quad \text{Eqn. 3}$$

where G(s) is the Laplace transform of the oscillator displacement X(s) in response to the Laplace transform of a force input U(s):

$$G(s) = \frac{X(s)}{U(s)} = \frac{\omega_n^2}{k\left(s^2 + \frac{\omega_n}{Q}s + \omega_n^2\right)}. \quad \text{Eqn. 4}$$

Here $\omega_n$, Q, and k are oscillator natural frequency, resonant quality, and spring constant. Laplace variable s=iω where ω is a frequency and i=√−1. This transfer function is applicable to oscillators with one vibrational mode. Similar relationships describe oscillators with other modal structures.

In Equation 3, as spring constant k is reduced, the tip response is also reduced. For oscillators with very low spring constant it may be difficult or impossible to generate the desired level of actuation effort by the base displacement method discussed previously. Tip actuation has no such limitation.

There are at least two additional advantages to be gained by the application of actuation effort to the motional body of the oscillator in devices for the mechanical detection of magnetic resonance. This type of actuation enables collocated feedback control and control of torsional modes of the oscillator.

Collocated feedback control of oscillator motion involves the application of actuation effort proximal, at or near, the location where oscillator motion is measured. Collocated feedback control systems offer stability advantages. In particular, a stable motion control system can be implemented in all collocated feedback systems. Noncollocated feedback systems, including all of those devices using base actuation of the oscillator, cannot necessarily be controlled.

Control of torsional modes of the oscillator is impractical by base displacement actuation, yet readily handled by the application of actuation effort directly to the motional body of the oscillator. In the simplified case of a cantilever oscillator, only tip displacement can be effected by displacement of the base. Base displacement has no effect on the twist of the cantilever tip. In contrast, an actuator can easily apply a torque at or near the tip of these cantilevers to counter torsional oscillator modes.

Controlling the motion of the oscillator offers several advantages over uncontrolled systems. One capability of control is a reduction in the amplitude of spurious oscillator vibrations. Reducing the Brownian amplitude of the oscillator vibration (see Equation 1) aids experiments in at least three ways. First, the spatial resolution of MRFM devices is generally limited to the thermal vibrational amplitude of the oscillator. Therefore damping the Brownian amplitude with control can enhance the spatial resolution of MRFM images. Second, thermal vibration of the oscillator makes the production and detection of magnetic resonance more difficult because the sample polarization field fluctuates with amplitude $$B_x^{rms} = x_{tip}^{rms} \frac{\partial B_x}{\partial x}$$

where $B_x$ is the component of the magnetic field produced by magnetic tip in the x-direction and $\partial B_x/\partial x$ is the gradient of this magnetic field component. These fluctuations are undesirable because a sample in a constant applied RF field will only undergo magnetic resonance within a limited range of polarization fields. Thus the application of control that damps the oscillator amplitude also aids signal production. Third, reducing the oscillator amplitude with feedback control techniques can help prevent "snap-in". By damping excursions of the oscillator, it is possible to scan close to the sample materials with a reduced likelihood that the magnetic tip will contact and stick to the sample.

A second major way in which feedback control can favorably alter oscillator motion is the modification of the natural dynamic properties of the oscillator. One of the most important ways that feedback control can alter oscillator dynamics is in damping oscillator motion, resulting in a lower resonant quality Q and damping time $\tau$. The expression previously given in Equation 2 for the power spectral density of the Langevin force that is often the dominant experimental noise source indicates that using high resonant quality oscillators is advantageous. While such oscillators have a lower thermal noise floor, their natural properties are unwieldy for signal detection. The bandwidth of the spectral response of an oscillator is approximately $\Delta\omega = \omega_n/Q$. Thus the high quality oscillators have a narrow response bandwidth. This narrow frequency response complicates signal detection because the natural frequency of the oscillator often drifts in response to changing experimental conditions. These small drifts can cause large changes in the motional response of a high quality oscillator, as evident from the transfer function given in Equation 4.

In addition to a narrow response bandwidth, high resonant quality oscillators also have a long damping time $\tau = Q/\omega_n$. Because the oscillator energy decays with the damping time, detection with oscillators having a long damping time is slow. By designing and implementing an appropriate motion controller, the response of the oscillator can be damped. This damped motion has a wider response bandwidth and a shorter damping time providing more stable and faster experimentation.

Another capability of a motion control system is the ability to produce desired oscillator motion by tracking a reference signal. Such tracking is similar to driving the cantilever and is useful for the same reasons: field modulation, sample scanning, device calibration, and improving experimental stability. The benefits to be gained by operating a device for mechanical detection of magnetic resonance with a driven oscillator were previously mentioned. The operation and performance of a device with a motion control system to achieve these benefits differs because all the previously mentioned benefits of cantilever control, such as reduced damping time and spurious vibrational amplitude, can be achieved while tracking the reference signal.

It is therefore an object of the present invention to provide a device for actuation and control of the oscillator in MRFM devices by the application of actuation effort to a location on the oscillator that undergoes resonant motion, thereby enabling actuation and control of oscillators with low spring constant as well as stiffer oscillators.

Further objects and advantages enabled by this type of actuation and control are to allow damping of the oscillator vibrational amplitude through feedback control, thereby enhancing the stability and spatial resolution of the device; to alter the oscillator dynamical properties such as damping time, resonant quality, and response bandwidth, which provides more stable MRFM signal detection; to vary the distance between the magnetic tip and the sample material, thereby enabling sample scanning and modulation of the sample polarization field; to enhance the stability and ease of use in MRFM devices by the application of actuation and control signals that help prevent the oscillator from contacting and sticking to the sample or other device components; to enable calibration of MRFM instrument subsystems such as the sensor for detecting oscillator motion; to allow control of all the oscillator modes, including torsional modes and high frequency displacement modes; and to provide collocated feedback control to the oscillator, when the control effort is applied near the location where displacement is measured, yielding dynamic advantages.

Another object of the present invention is to provide a means for digital implementation of the controller dynamics, thus enabling quick configuration and also adaptation to changing feedback requirements. Still further objects and advantages of the present invention will become apparent from a consideration of the drawings and ensuing description.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of this disclosure.

Figure 1A:
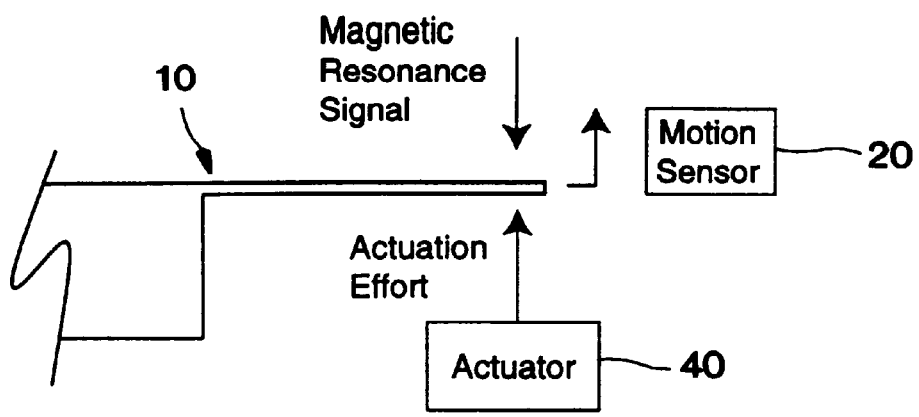
FIG. 1A is a schematic diagram of an apparatus for mechanically detecting magnetic resonance signals containing an actuator.
Figure 1B:
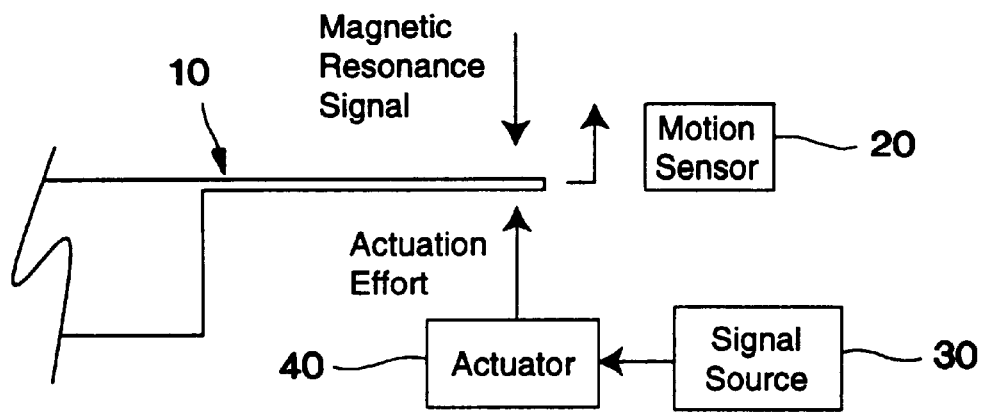
FIG. 1B is the schematic diagram of an MRFM apparatus including a signal source.
Figure 1C:
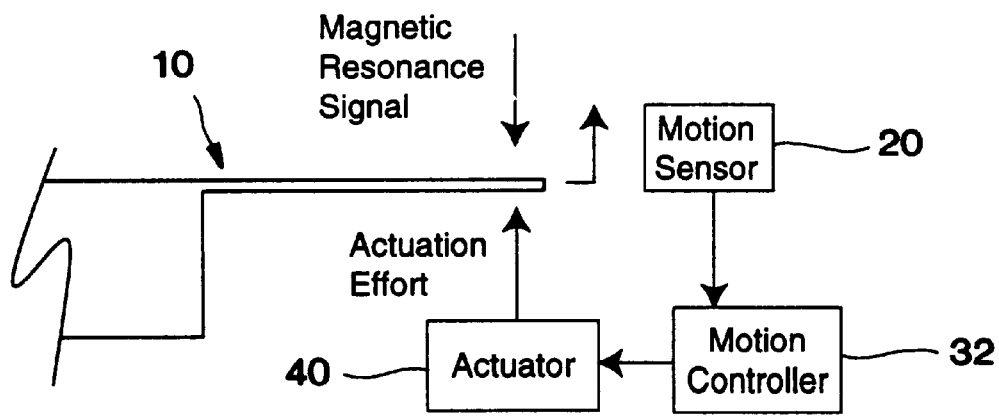
FIG. 1C is the schematic diagram of an MRFM apparatus including a motion controller.

The invention consists of an apparatus for mechanical detection of magnetic resonance signals that has an actuator that can be used to induce oscillator motion, cancel oscillator motion, or alter oscillator dynamics. An actuator as defined herein provides actuation effort to the motional body of an oscillator in order to induce motion therein. Actuation effort may be a force or a torque. FIG. 1A depicts a simplified representation of this apparatus. Oscillator 10 responsive to a magnetic resonance signal is acted upon by actuator 40. The motion of the oscillator resulting from magnetic resonance and/or actuation is detected by motion sensor 20. FIG. 1B shows this basic apparatus with the addition of a signal source 30 coupled to the actuator. FIG. 1C shows the basic apparatus with the addition of a motion controller 32, responsive to the measured motion of the oscillator and coupled to the actuator.

In operation, the MRFM apparatus contains a mechanical oscillator, a magnetic tip and a sample material containing magnetic spins having a spin resonance frequency. A magnetic tip is a magnetic material of appropriate size, shape and polarization to produce a magnetic field distribution for the production of MRFM signals. The field distribution often includes a gradient with distance scales smaller than the sample. The sample material and magnetic tip are brought into close proximity, with one of them being mounted on the mechanical oscillator. If the sample is mounted on the mechanical oscillator, a holder is used to mount the magnet. If the oscillator contains a magnetic tip, a holder is used to mount the sample. This holder can be any suitable material. The holder can also be capable of translating in the x-, y- and z- directions. When magnetic resonance occurs in the sample material, the sample magnetization changes causing a magnetic force between the sample and the magnetic tip. This force results in oscillator motion. A motion sensor capable of detecting oscillator motion and an actuator that applies actuation effort to the oscillator are also present. The motion sensor is adapted to be coupled with the oscillator. In addition to these elements, a signal source may be present to induce oscillator motion. Alternately, or in addition, a motion controller may be present to induce oscillator motion, cancel oscillator motion, or alter the oscillator dynamics.

Figure 2:
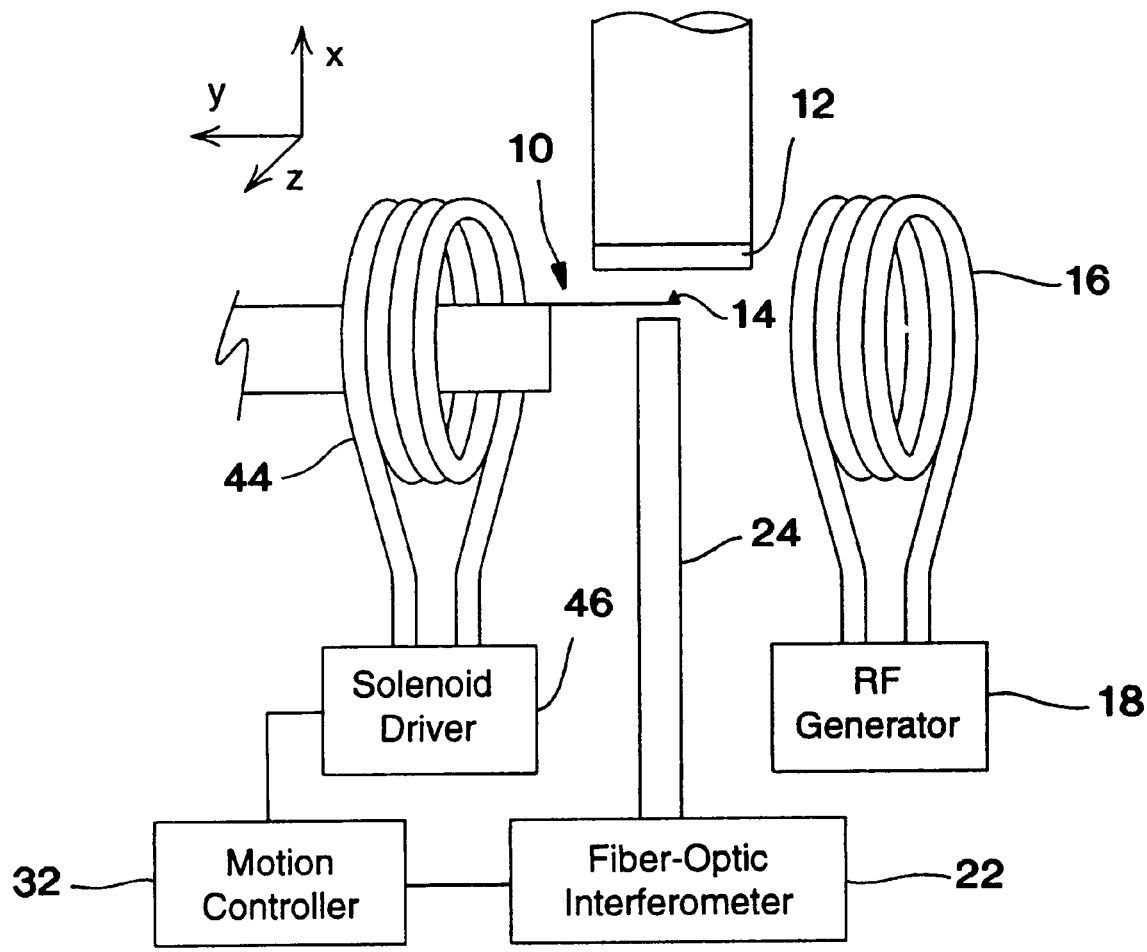
FIG. 2 is a diagram illustrating one implementation of the present invention, which includes an RF generator, fiber-optic interferometer and motion controller.

FIG. 2 shows a diagram of a preferred embodiment of the present invention. At the heart of this device is a mechanical oscillator 10 with a magnetic tip 14 located in close proximity to sample material 12. A nearby radio-frequency (RF) coil 16 delivers RF power from RF generator 18 to the sample material. Optical fiber 24 is part of a fiber-optic interferometer 22 that senses the motion of the oscillator. Actuation is provided using a solenoid driver 46 and solenoid 44 to apply magnetic fields to the magnetic tip. The signals coupled to the solenoid driver may be generated by a motion controller 32 which may include a signal source.

Figure 3A:
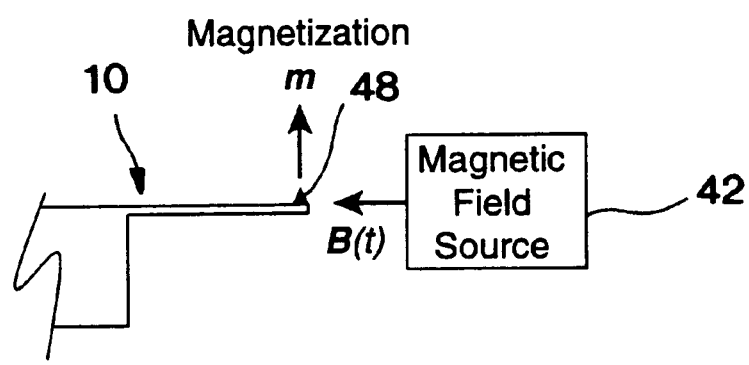
FIG. 3A is a diagram illustrating torsional magnetic actuation of the oscillator.

FIG. 3A shows another representation of the torsional magnetic actuation system used in the apparatus of FIG. 2. Oscillator 10 has an actuation magnet 48 disposed at a location that undergoes resonant motion. The actuation magnet may be any magnetic material. In FIG. 2 the actuation magnet is the same magnetic tip 14 used to detect magnetic resonance signals. In FIG. 3A, a magnetic field source 42 applies magnetic fields to the actuation magnet. One source of magnetic fields is a solenoid (coil). The actuation magnet is illustrated near the end of the oscillator, but could be located anywhere on the motional body.

Figure 4:
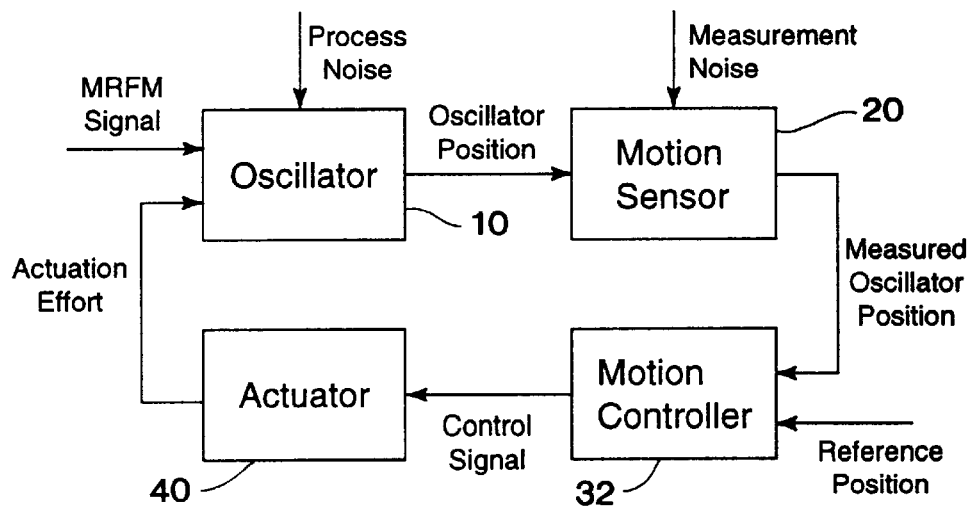
FIG. 4 is a block diagram of a motion control system.

A block diagram depicting the preferred implementation of the motion control system is presented in FIG. 4. The oscillator 10 is acted upon by an MRFM signal, an actuator 40, and also process noise. The oscillator position is measured by motion sensor 20, which introduces measurement noise. The resulting measurement and a desired reference position are the inputs to motion controller 32. The reference position is often zero when it is desirable to control the cantilever at one position. A nonzero reference position, such as a sinusoidal displacement, can be used when cantilever motion is desired. From these inputs the motion controller produces a control signal for altering oscillator motion. The control signal is delivered to the oscillator by means of actuator 40.

Figure 5:
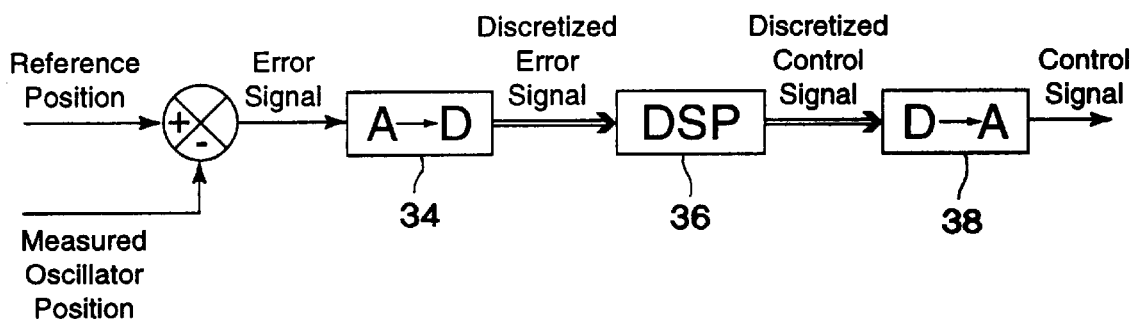
FIG. 5 is a block diagram of a digital motion controller.

FIG. 5 presents a block diagram representation of a digital motion controller. This embodiment uses an analog to digital converter 34, a digital signal processor 36, and a digital to analog converter 38 to produce the control signal from the measured cantilever position and a reference position.

The magnetic interaction between a sample material that undergoes magnetic resonance and a magnetic tip is the basis for mechanically detected magnetic resonance. By applying appropriate magnetic polarization and radio-frequency fields to the sample material, magnetic resonance alters the sample magnetization. The induced changes in sample magnetization acting upon the magnetic tip cause detectable changes in the motion of the oscillator.

FIG. 2 presents one embodiment of a device for force detected magnetic resonance with magnetic tip 14 located on oscillator 10. In this embodiment, the magnetic tip is the sole source of the sample polarization field. Additional magnetic polarization fields can also be applied from external sources. The combination of this polarization field and an RF field generated by RF field generator 18 and applied with RF coil 16 causes magnetic resonance in sample material 12. Any other method of generating radio-frequency fields can be used including, but not limited to, multiple coils, stripline oscillators, tuned cavities and resonant circuits. The magnetic resonance alters the force between the magnetic tip and the sample material, producing detectable changes in the oscillator motion.

The embodiment in FIG. 2 uses a fiber-optic interferometer 22 to sense oscillator motion. Interference fringes produced by light reflecting off the end of optical fiber 24 and oscillator 10 indicate oscillator displacement. Oscillator motion can also be sensed by other methods.

In the embodiment of FIG. 2, actuation is applied to the oscillator via torsional magnetic actuation. Torsional magnetic actuation involves the application of a magnetic actuation field to an actuation magnet located on the oscillator. A torque is produced on the oscillator when the magnetic actuation field has a direction substantially perpendicular to the polarization direction of the actuation magnet. "Substantially perpendicular" indicates that the magnetic actuation field has the largest component in the perpendicular direction to the polarization direction of the actuation magnet.

In the configuration of FIG. 2, further illustrated in FIG. 3A, torque $\tau = m_x B_y^a$ is produced by actuation field $B_y^a$ applied to actuation magnet 48 with magnetic moment $m_x$. This torque produces an effective actuation force $f_x$ at the location of the actuation magnet. The magnitude of the effective actuation force varies with the specific geometry of the oscillator, the location of the actuation magnet, and the frequency of the applied actuation signal. The actuator force may contain at least one frequency component substantially equal to an oscillator resonance frequency. For the case of an oscillator that is a simple prismatic cantilever of length $l_c$, with an actuation magnet located at the free end of the cantilever, an applied actuation torque at the fundamental oscillator resonance frequency $\omega_n$ produces an effective actuation force $f_x = 1.377\, \tau_z 1\, l_c$. The actuator response for other experimental configurations can be determined through analytic calculation by those skilled in the art or by experimental characterization.

While not required, it is advantageous to apply the actuation field in a direction substantially perpendicular to the direction that the magnetic tip is polarized. Actuation fields applied in this direction have less effect upon the polarization field of the sample material.

The specific configuration of torsional magnetic actuation depicted in FIG. 2 has two inherent advantages over alternate configurations. First, the magnetic tip 14 also serves as the actuation magnet (48 in FIG. 3A), thus simplifying the device. In the event that the magnetic tip has insufficient magnetic moment to serve as the actuator magnet, additional magnetic material can deposited on the oscillator. The second advantage of this configuration is that by using magnetic tip 14 for torsional magnetic actuation, applied actuation fields are automatically applied substantially perpendicular to the polarization direction of the magnetic tip. For these reasons, torsional magnetic actuation acting directly upon the magnetic tip 14 is a natural choice for actuation in devices for mechanical detection of magnetic resonance.

Coupling a signal source to the actuator for driving the oscillator with a desired periodic waveform is useful for field modulation, sample scanning, device calibration, and improving experimental stability. The most desired waveform is a sinusoid, but other waveforms can be used. Modulation of the polarization field of the sample material by driving the oscillator occurs as a result of relative motion in the presence of a field gradient. The inhomogeneous magnetic field produced by the magnetic tip has a magnitude that varies as a function of distance from the magnetic tip. Thus by driving the oscillator, and hence changing the separation between the magnetic tip and the sample material, the magnitude of the magnetic field at the sample material can be adjusted. Adjusting this field is useful for modulating the magnetic resonance in the sample material and therefore aids in producing detectable signals.

By using actuation to vary the spacing between the magnetic tip and the sample material, different portions of the sample can be made to undergo magnetic resonance as the polarization field changes. Thus by driving the oscillator, and hence changing the polarization field in the sample material, applied actuation effort can be useful for sample scanning. Actuation effort and hence sample scanning has utility for AC and DC sample scanning. AC scanning refers to generating dynamic changes in oscillator position, so that different locations in the sample are sensed using magnetic resonance. DC scanning refers to motion of the oscillator to a static location.

Driving the oscillator can be further useful for measuring oscillator properties such as natural frequency and resonant quality. These parameters can be ascertained from the dynamical response of the oscillator to a stimulus such as applied actuation. Driving the oscillator can also help calibrate instrument subsystems such as a motion sensor. For example, calibration of fiber-optic interferometer 22 of FIG. 2, can be accomplished by driving the cantilever and monitoring the interferometer output. If the oscillator amplitude is sufficient, the maximum and minimum intensities of the optical interference pattern can be recorded. These values can then be used together with known parameters, such as the wavelength of the light used for detection, to calibrate the fiber-optic interferometer. Another method for calibrating the interferometer involves the use of the maximum and minimum intensities of the optical interference pattern from static deflection of the oscillator. Other calibration methods are known to those skilled in the art.

Finally, actuation of the oscillator can help improve the stability of devices that mechanically detect magnetic resonance signals. Sometimes electrostatic and other interactions will cause the oscillator to stick to the sample material or other components such as the motion sensor. Oscillators that have a low spring constant that are operated in close proximity to samples are particularly prone to this "snap-in" Driving the oscillator can be a useful technique to allow the oscillator to approach the sample without "snap-in". By driving the oscillator to an appropriate amplitude before bringing it close to the sample material, the energy in the oscillator resists "snap-in".

Additional advantages are to be gained by coupling the actuator to a motion controller that is responsive to the motion of the oscillator. Feedback signals are determined from measurements of oscillator motion and reference signals that are applied to the motion controller. These reference signals are the desired reference positions, either a static displacement (including no displacement) or a dynamic displacement specified as a function of time (such as a sinusoidal drive amplitude). These feedback signals are applied to the oscillator using the actuator to beneficially alter the oscillator response.

FIG. 4 shows a block diagram representation of one implementation of an oscillator motion control system. Motion controller 32 acts upon measurements of the oscillator position and a reference position to produce the control signal. Actuator 40 delivers the control effort based on this signal to the oscillator 10 to beneficially alter the oscillator motion. Process noise and measurement noise effect the performance of the control system and can be considered in the design of the motion controller 32.

Methods for the design and implementation of an appropriate motion controller that produces the desired changes in oscillator motion are apparent to those skilled in the art. Traditional controller design techniques such as pole placement, optimal control design techniques such as linear quadratic gaussian (LQG) control, and exotic design techniques such as fuzzy logic are some possible controller design strategies. Among the options for controller implementation are analog circuits and digital signal processing (DSP) circuits.

FIG. 5 presents a block diagram representation of a digital motion controller. This embodiment uses an analog to digital converter 34 to digitize the error between the measured cantilever position and a desired reference position. A digital signal processor 36 computes an appropriate control signal from this discretized error signal. The discrete control signal is converted to an analog control signal by a digital to analog converter 38. This control signal is then coupled to actuator 40 as illustrated in FIG. 4 and applied to the oscillator.

If the reference position of FIG. 4 and FIG. 5 is nonzero, an appropriate motion controller can cause the oscillator response to track the reference signal. In this embodiment, the motion controller tries to reduce the difference between the measured oscillator position and the reference signal. In contrast to the aforementioned method of simply driving the oscillator, tracking control has a more precise response. Tracking can be achieved while simultaneously reducing the thermal vibrational amplitude of the oscillator and altering the oscillator dynamics for reasons such as reducing oscillator resonant quality Q.

An additional note on the operation of motion control systems is that the benefits are achievable without a loss in the experimental signal-to-noise ratio (snr). The snr of an experiment performed in both open- and closed-loop systems is identical provided that the motion controller itself does not introduce additional noise.

The plots contained in FIG. 7 illustrate several of the aforementioned benefits from the application of feedback control to oscillators. These plots present the frequency response of the motion of an MRFM oscillator with varying levels of control effort. The dots on the plots are experimental measurements of oscillator motion and the solid lines are the corresponding predicted response. The dash dot line is the predicted actual oscillator response. In practice the actual motion can only be inferred from measurements.

Oscillator dynamics were regulated with second order LQG optimal controllers applying zero (shown in FIG. 7A), minimal (shown in FIG. 7B), moderate (shown in FIG. 7C), and substantial (shown in FIG. 7D) levels of damping. Minimal damping refers to an amount of damping comparable to the intrinsic damping of the oscillator. Moderate damping refers to an amount of damping significantly more than the intrinsic damping of the oscillator, but not enough damping to result in a heavily damped oscillator. Substantial damping refers to the application of strong damping, such that a heavily damped oscillator results. Controllers were implemented with analog circuitry and applied to the oscillator with the apparatus of FIG. 2.

The oscillator used in the experiments illustrated in FIG. 7 had uncontrolled properties $\omega=2\times5413$ Hz, $Q=2013$, and $k=0.104$ N/m. At 300° K., the Brownian amplitude of the cantilever tip was reduced from 2 Å for the uncontrolled case (shown in plot FIG. 7A) to 0.65 Å (shown in plot FIG. 7B), 0.25 Å (shown in plot FIG. 7C), and 0.16 Å (shown in plot FIG. 7D) with increased control. Damping time of the dominant system poles was reduced in a similar fashion from 60 msec to 6 msec, 0.6 msec, and 0.15 msec using zero, minimal, moderate or substantial levels of damping, respectively. FIG. 7 also shows the controller damping resonant quality, broadening the cantilever frequency response.

One important note is that the control signals applied to produce these beneficial changes in oscillator motion are of a frequency at or near the oscillator resonant frequency. If the control signals are not applied at or near the oscillator resonant frequency, the vibrational amplitude of the resonance cannot be reduced, and the resonant quality and damping time associated with the resonance are not affected.

While the preferred embodiment of this invention has been illustrated and described, it will be appreciated that various changes can be made therein without departing from the spirit and scope of the invention. The form and operation of several alternate embodiments will be described here. Additional embodiments within the scope of the invention will be obvious to those skilled in the art.

Alternative embodiments of the present intention can have various means for generating a mechanically detected magnetic resonance signal, various oscillators, various means for sensing the motion of the oscillator, various means for actuating the oscillator, and various motion controllers.

The aforementioned embodiment depicted in FIG. 2 uses force detected magnetic resonance with a magnetic tip disposed on the oscillator. Force detected magnetic resonance may have either sample material or the magnetic tip mounted on the oscillator. If the sample is mounted on the oscillator, another magnet may be mounted on the oscillator for actuation purposes. In addition, the specific location on the oscillator where these elements are mounted is not to be limited to the tip, nor is the specific polarization direction of the magnetic tip limited to the easy axis of oscillator motion. Configurations in which the magnetic tip or sample material are disposed on any part of the oscillator that undergoes resonant motion, and are oriented in any direction, are viable alternatives for mechanically detected magnetic resonance. It is preferable to have the sample on the sample/magnet holder to facilitate changing the sample when different samples are scanned. It is possible to position the gradient magnet on the sample/magnet holder when fabrication techniques hinder the inclusion of the gradient magnet on the oscillator.

The mechanically detected magnetic resonance signals of the present invention should not be limited strictly to those involving the generation of magnetic forces between the magnetic tip and the sample. Devices in which a torque on the oscillator, rather than a force, is generated by the magnetic resonance interaction will similarly benefit from the application of the actuation and control techniques of the present invention. In practice, the magnetic resonance phenomenon alters the energy of the system containing the sample material and magnetic tip, thereby effecting the motion of the oscillator in a detectable manner. Various means by which this energy interaction can effect the oscillator motion are readily apparent to those skilled in the art. Thus the actuation and control techniques disclosed by this patent are readily applicable to a variety of devices for the mechanical detection of magnetic resonance. Oscillator 10 described in the preferred embodiment was a simple cantilever beam operating in a displacement mode. However, under some circumstances it may be advantageous to use alternate oscillators as signal detectors. The present invention may be applied to torsional oscillators, membrane oscillators, "guitar string" type oscillators, and cascade oscillators, in which multiple coupled oscillators are combined. Detection devices may also find advantage in the use of multiple oscillators for simultaneous detection of signals. The use of multiple oscillators would allow scanning multiple regions of a sample simultaneously, enhancing the speed of the imaging process.

The preferred embodiment also uses a motion sensor consisting of a fiber-optic interferometer. A variety of alternate motion sensors can be utilized for sensing oscillator motion, including, but not limited to, sensors based upon the angle that light reflects from the oscillator, the tunneling current between a probe and a conductive oscillator, variations in capacitance between a conductive oscillator and a nearby surface, variations in oscillator piezoresistivity and voltage from piezoelectric oscillators.

There are a wide variety of actuators available to provide actuation effort to the motional body of the oscillator. FIG. 3A through 3I illustrate some of these devices. In each, the oscillator is depicted by reference number 10.

Figure 3B:
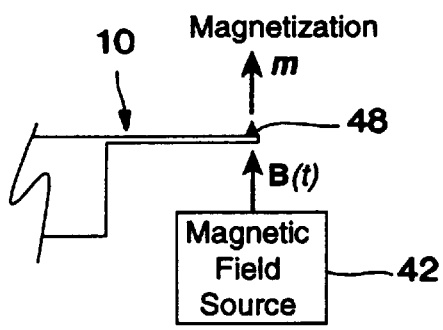
FIG. 3B is a diagram illustrating magnetic actuation of the oscillator.
Figure 3C:
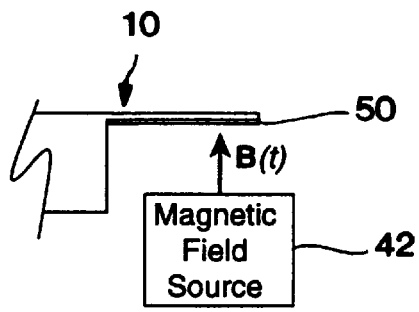
FIG. 3C is a diagram illustrating magnetostrictive actuation of the oscillator.

There are several ways to provide actuation effort with an applied magnetic field B(t). FIG. 3A depicts torsional magnetic actuation, which was previously described. FIG. 3B shows a magnetic field source 42 acting on an actuation magnet 48 to produce a magnetic actuation force. FIG. 3C depicts an oscillator 10 with a magnetostrictive material 50 such that the application of magnetic fields from a magnetic field source 42 flexes the lever. Magnetic fields can be generated in a number of ways, including using a solenoid or permanent magnet. It may be desirable to apply the magnetic actuation fields using the same components used to generate the RF field, such as a coil, because this simplifies the apparatus.

In actuators that use a magnet affixed to the motional body of the oscillator, it is desirable to use magnets that have a high intrinsic coercivity and include a passivation layer. Materials with a high intrinsic coercivity are those materials that are magnetically hard and have magnetic domains that resist reorientation when control fields are applied. The reorientation of magnetic domains can be a source of experimental noise and actuator nonlinearity. Passivation treatments or layers render the surface of the magnet resistant to oxidation. Oxidation of the magnet alters the magnetic properties of the magnet.

Figure 3D:
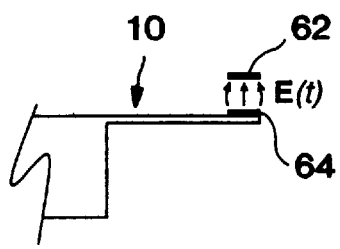
FIG. 3D is a diagram illustrating electric actuation of the oscillator.
Figure 3E:
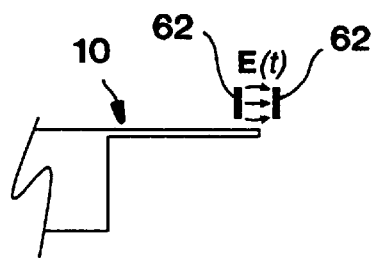
FIG. 3E is a diagram illustrating a second embodiment of electric actuation of the oscillator.
Figure 3F:
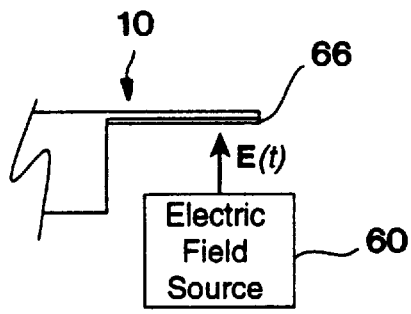
FIG. 3F is a diagram illustrating piezoelectric actuation of the oscillator.

Actuators based upon electric fields E(t) are also useful. FIG. 3D shows an actuator in which an electrically conductive layer 64 is disposed on the motional body. An electrically conductive material 62 is placed in close proximity. The oscillator can be actuated by applying electric charges to the conductors. FIG. 3E depicts a dielectrophoretic actuation system in which a dielectric oscillator is attracted to the region of high electric field between two charged electrically conductive materials 62. FIG. 3F shows a piezoelectric oscillator actuation system where a layer of piezoelectric material 66 on the oscillator undergoes strain due to fields from an electric field source 60. This strain actuates the oscillator.

Figure 3G:
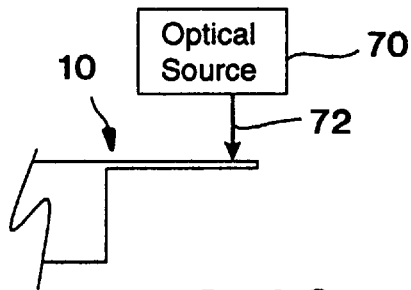
FIG. 3G is a diagram illustrating actuation of the oscillator by photon pressure.
Figure 3H:
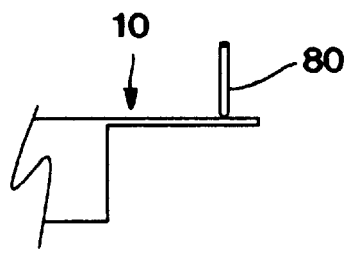
FIG. 3H is a diagram illustrating mechanical actuation of the oscillator.
Figure 3I:
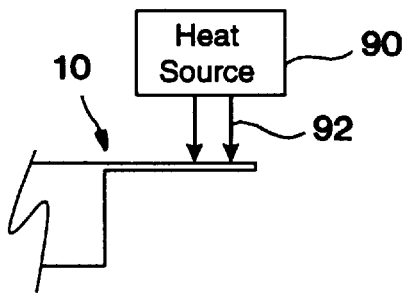
FIG. 3I is a diagram illustrating thermoelastic actuation of the oscillator.

FIG. 3G shows a cantilever being deflected by photon pressure. Optical power 72 produced by an optical source 70 either reflects off or is absorbed by the oscillator. The resultant momentum transfer can actuate the oscillator. In FIG. 3H a mechanical vibrator 80 directly applies actuation effort to oscillator 10. In FIG. 3I energy 92 applied to the cantilever from a heat source 90 causes a portion of the oscillator to heat faster than a different portion of the oscillator. The differential expansion rates can actuate the cantilever by thermoelastic bending. One source of heat that can be used is power from an optical source.

This list is not meant to limit the scope the invention but illustrate a number of means for delivering actuation effort to the motional body of the oscillator. Different configurations and different physical phenomena that can be exploited to provide actuation will be apparent to those skilled in the art.

Finally, a number of options present themselves for implementing the motion controller. Feedback can be accomplished with a variety of analog and digital based motion control systems. Adaptive controllers can also be designed and implemented with both of these types of controllers. Adaptive controllers have dynamics that are adjusted to changes in experimental conditions or feedback requirements.

The digital motion controller depicted in FIG. 5 is only one option for motion control. Many different components can be selected for doing the signal conversion from analog to digital and optionally, back to analog. In addition, a wide variety of processors and processing algorithms exist. Finally, there are options for varying the controller structure. For example, a digitized version of the measured cantilever motion could be subtracted from a digitized version of the reference output by the DSP.

Figure 6:
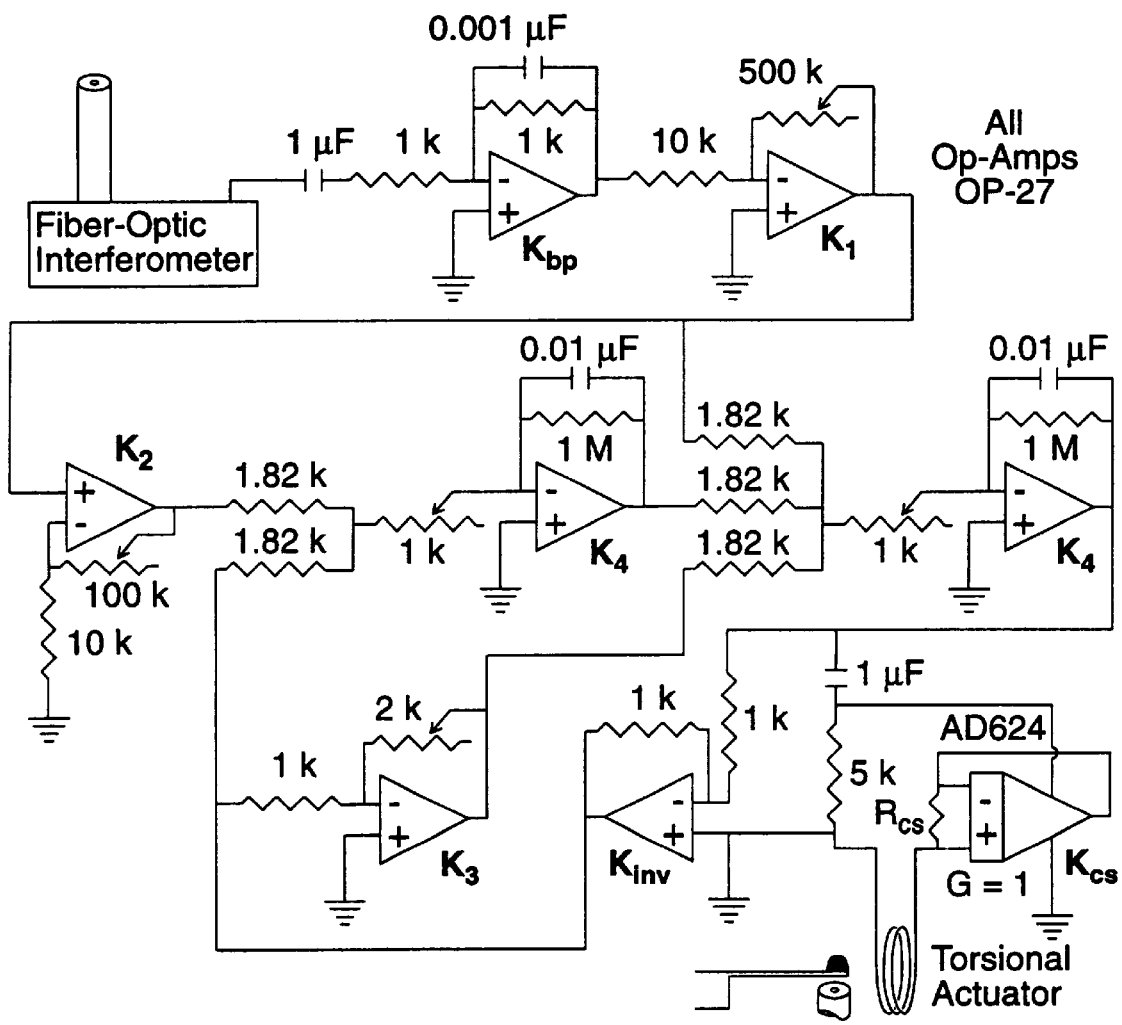
FIG. 6 is a schematic diagram of an analog motion controller.
Figure 7C:
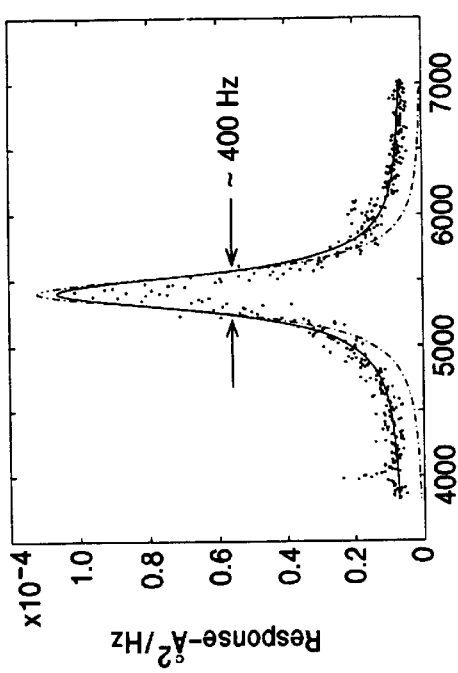
FIG. 7 shows plots of the power spectral density of oscillator motion when zero(A), light(B), moderate(C), and strong damping(D) are added by a motion control system.
Figure 7D:
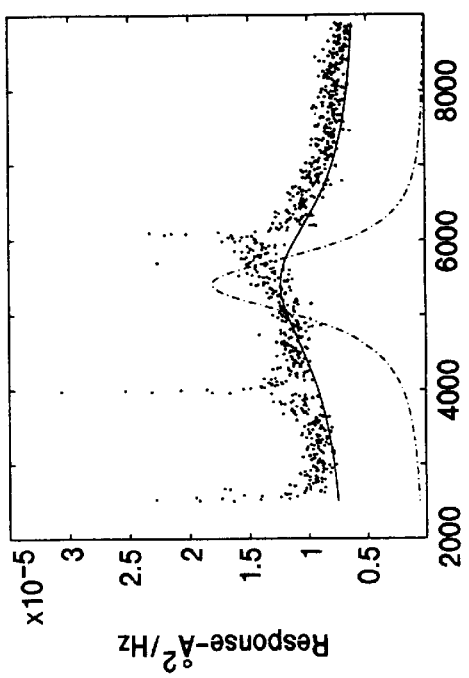
Figure 7A:
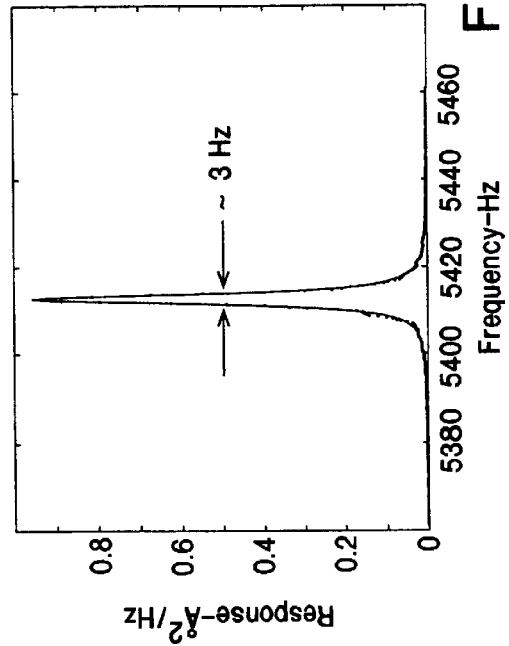
Figure 7B:
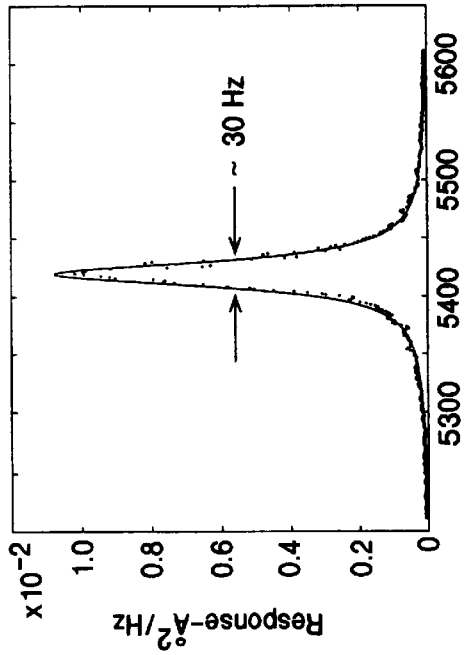

Analog control systems can also be implemented to control cantilever motion. The circuit depicted in FIG. 6 is one such circuit. This circuit uses a number of operational amplifiers to implement a state feedback filter. The filter was designed for implementing second order LQG optimal controllers of cantilever dynamics. This specific filter has one real zero and two complex conjugate poles. FIG. 6 is meant only to illustrate one method for analog controller implementation.

Adaptive control employs a motion control system with the ability to adapt to changes in the behavior of the oscillator or to changing feedback requirements. Oscillator properties are known to vary in devices that mechanically detect magnetic resonance. As the temperature and pressure of the device, or spacing between the magnetic tip and sample material changes, the oscillator can change undergo dynamic changes such as shifts in resonant frequency and quality. These changes complicate experiments and motivate the use of controllers that sense changes in the oscillator and adapt to continue to provide adequate motion control. Adaptive control may also be motivated by changing feedback requirements such as the desire to control the cantilever to a large amplitude. For example, controlling to large amplitudes often requires reconfiguration so that larger experimental signals are kept within the operational limits of all circuit components. In adaptive controllers, the controller is modified when these needs arise.

Both analog and digital motion control systems have the ability to undergo adaptive modification of the feedback parameters. With digital based systems this modification can be accomplished by downloading new controller instructions to the digital signal processor, or changing the values of constants stored in its memory. Analog based systems can use amplifiers with programmable gains to implement controller dynamics. Alternately, semiconductor structures known as programmable analog arrays allow rapid implementation and reconfiguration of analog circuits by reprogramming the values and interconnections of circuit elements.

Accordingly, the reader will see that the method and apparatus for actuation and control in devices for mechanically detecting magnetic resonance can aid detection by altering the motion of the oscillator. The device we describe can advantageously:

- dampen the vibrational amplitude of the oscillator that can diminish the spatial resolution of the device;
- control the oscillator dynamical properties to allow more stable signal detection;
- vary the distance between the magnetic tip and the sample material for sample scanning and field modulation;
- apply actuation and control signals to help prevent the oscillator from contacting and sticking to the sample material or other device components;
- provide a method for calibrating instrument subsystems;
- provide a way for controlling all oscillator vibrational modes, including torsional modes; and
- provide a way to apply collocated feedback control to the oscillator, thereby gaining dynamic advantages in the control implementation.

All references cited are incorporated by reference in their entirety to the extent not inconsistent with the disclosure herein. The description above should not be construed as limiting the scope of the invention but as merely providing illustrations of some of the presently preferred embodiments of this invention. Additional implementations will be readily apparent to those skilled in the art.

We claim:

1. A magnetic resonance force microscopy apparatus for use in combination with an oscillator, said oscillator having a motional body and having a first member of a sample/magnet pair disposed on said motional body, said apparatus comprising:
   - a sample/magnet holder adapted to mount a second member of a sample/magnet pair;
   - an RF field generator positioned to apply a field to said sample;
   - a motion sensor adapted to be coupled with said motional body;
   - an actuator adapted to be coupled with said motional body; and
   - a motion controller coupled with said actuator and with said motion sensor.

2. The apparatus of claim 1, wherein said motional body is adapted to hold the magnet member of said sample/magnet pair.

3. The apparatus of claim 1, wherein said sample/magnet holder is adapted to hold the magnet member of said sample/magnet pair.

4. The apparatus of claim 1, wherein said RF field generator comprises a coil.

5. The apparatus of claim 1, wherein said sample/magnet holder is a translating holder in one or more directions.

6. The apparatus of claim 1, wherein said motion controller includes a signal source.

7. The apparatus of claim 1, wherein said motion controller is a digital motion controller.

8. The apparatus of claim 1, wherein said motion controller is an analog motion controller.

9. The apparatus of claim 1, wherein said motion sensor comprises an interferometer with a light source.

10. The apparatus of claim 1, wherein said actuator is selected from the group consisting of magnetic, electric, optical, thermal, piezoelectric, magnetostrictive, and mechanical actuators.

11. The apparatus of claim 1, wherein said actuator comprises an electrically conductive layer and further comprises an electric field generator electrically coupled with said electrically conductive layer.

12. The apparatus of claim 1, wherein said actuator comprises a magnetic field generator and further comprises a magnetostrictive material positioned on said motional body.

13. The apparatus of claim 1, wherein said actuator comprises an optical source optically coupled with said motional body.

14. The apparatus of claim 1, wherein said actuator comprises a mechanical vibrator mechanically coupled with said motional body.

15. The apparatus of claim 1, wherein said actuator comprises a heat source thermally coupled with said motional body.

16. The apparatus of claim 1, wherein said actuator comprises an electric field generator and further comprises a piezoelectric material positioned on said motional body.

17. The apparatus of claim 1, wherein said actuator applies an actuator force to said oscillator wherein said actuator force contains at least one frequency component substantially equal to an oscillator resonant frequency.

18. The apparatus of claim 1, wherein said motion controller delivers a signal to said actuator in response to said motion sensor, wherein the dynamic response of said motion controller is adapted in response to changes in said magnetic resonance force microscopy apparatus.

19. The apparatus of claim 1, wherein said motion controller delivers a signal to said actuator in response to said motion sensor, wherein the dynamic response of said motion controller is adapted in response to changes in experimental protocol.

20. The apparatus of claim 1, wherein said motion sensor senses motion of said motional body at a sensed location and wherein said actuator is located proximal to said sensed location.

21. The apparatus of claim 1, wherein said actuator comprises a magnetic field generator and further comprises an actuator magnet positioned on said motional body.

22. The apparatus of claim 21, wherein said magnetic field generator produces a magnetic field substantially perpendicular to the polarization direction of said actuator magnet.

23. The apparatus of claim 21, wherein said magnetic field generator produces a magnetic field substantially parallel to the polarization direction of said actuator magnet.

24. The apparatus of claim 21, wherein said magnetic field generator comprises a solenoid.

25. The apparatus of claim 21, wherein said actuator magnet is a member of said sample/magnet pair.

26. The apparatus of claim 21, wherein said actuator magnet is not a member of said sample/magnet pair.

27. The apparatus of claim 21, wherein said actuator magnet has a high intrinsic coercivity.

28. The apparatus of claim 21, wherein said actuator magnet has undergone a passivation treatment.

29. The apparatus of claim 1, wherein said actuator comprises an electric field generator electrically coupled with said motional body.

30. The apparatus of claim 29, wherein said electric field generator generates a field substantially parallel to said motional body.

31. The apparatus of claim 29, wherein said electric field generator generates a field substantially perpendicular to said motional body.

32. The apparatus of claim 1, wherein said RF field generator serves as part of said actuator by additionally generating actuation fields.

33. A method of oscillator actuation in a magnetic resonance force microscopy system, said system having an oscillator having a motional body, said motional body movable in response to magnetic resonance in a sample, said method comprising the steps of:

inducing magnetic resonance in said sample;

detecting motion of said motional body; and applying actuation force to said motional body of said oscillator.

34. The method of claim 33, wherein said actuation force is driven by a motion controller coupled with said actuator and responsive to detected motion.

35. The method of claim 33, wherein said actuation force is driven by a signal source whereby said motional body undergoes motion.

36. The method of claim 35, further comprising the step of calibrating said system in response to detected motion of said motional body wherein said step of calibration is performed before, after or simultaneously with the step of inducing magnetic resonance.

37. A method of preventing sticking of said oscillator to another member of said magnetic resonance force microscopy system comprising the method of claim wherein said motional body motion undergoes periodic motion with an amplitude sufficient to prevent sticking of said oscillator to said other member.

38. The method of claim 33 wherein said magnetic resonance force microscopy system comprises:

a sample/magnet holder adapted to mount the second member of a sample/magnet pair;

an actuator adapted to be coupled with said motional body; and a motion controller coupled with said actuator and with said motion sensor.

* * * * *

UNITED STATES PATENT AND TRADEMARK OFFICE
CERTIFICATE OF CORRECTION

PATENT NO. : 6,181,131 B1  
DATED : January 30, 2001  
INVENTOR(S) : Bruland et al.

Page 1 of 1

It is certified that error appears in the above-identified patent and that said Letters Patent is hereby corrected as shown below:

Column 2,  
Line 1, replace the formula with -- $F(t) = \iiint \nabla (M \bullet B) dv$ --

Column 9,  
Line 31, replace "torque $\tau = m_x B_y^a$ is produced" with -- torque $\tau_z = m_x B_y^a$ is produced --.  
Line 44, replace "$f_x = 1.377 \tau_z 1 \ 1_c$." with -- $f_x = 1.377 \tau_z / 1_c$. --.

Column 12,  
Line 5, replace "uncontrolled properties $\omega = 2 \times 5413$ Hz" with -- uncontrolled properties $\omega_n = 2 \pi \times 5413$ Hz --.

Column 13,  
Line 29, replace "3A through 3l illustrate" with -- 3A through 3I illustrate --.

Column 18, claim 37,  
Line 8, replace "the method of claim wherein" with -- the method of claim 35 wherein --.

Signed and Sealed this

Twentieth Day of November, 2001

*Attest:*

*Attesting Officer*

NICHOLAS P. GODICI  
*Acting Director of the United States Patent and Trademark Office*

UNITED STATES PATENT AND TRADEMARK OFFICE
CERTIFICATE OF CORRECTION

PATENT NO. : 6,181,131 B1  
DATED : January 30, 2001  
INVENTOR(S) : Bruland et al.

Page 1 of 1

It is certified that error appears in the above-identified patent and that said Letters Patent is hereby corrected as shown below:

Column 2,
Line 1, replace the formula with -- $F(t) = \iiint_v \nabla (M \cdot B) dv$ --

Column 9,
Line 31, replace "torque $\tau = m_x B_y^a$ is produced" with -- torque $\tau_z = m_x B_y^a$ is produced --.
Line 44, replace "$f_x = 1.377 \tau_z 1 \; 1c \cdot$" with -- $f_x = 1.3777 \tau z / \ell c \cdot$ --.

Column 12,
Line 5, replace "uncontrolled properties $\omega = 2 \times 5413$ Hz" with -- uncontrolled properties $\omega_n = 2 \pi \times 5413$ Hz --.

Column 13,
Line 29, replace "3A through 31 illustrate" with -- 3A through 3I illustrate --.

Column 18, claim 37,
Line 8, replace "the method of claim wherein" with -- the method of claim 35 wherein --.

This certificate supersedes Certificate of Correction issued November 20, 2001.

Signed and Sealed this

Nineteenth Day of February, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,181,131 B1
DATED : January 30, 2001
INVENTOR(S) : Bruland et al.

It is certified that error appears in the above-identified patent and that said Letters Patent is hereby corrected as shown below:

Column 2,
Line 1, replace the formula with -- $F(t) = \iiint_v \nabla (M \cdot B) dv$ --

Column 9,
Line 31, replace "torque $\tau = m_x B_y^a$ is produced" with -- torque $\tau_z = m_x B_y^a$ is produced --.
Line 44, replace "$f_x = 1.377 \tau_z 1 \: 1c\cdot$" with -- $f_x = 1.377 \tau_z / \ell_c$. --.

Column 12,
Line 5, replace "uncontrolled properties $\omega = 2 \times 5413$ Hz" with -- uncontrolled properties $\omega_n = 2\pi \times 5413$ Hz --.

Column 13,
Line 29, replace "3A through 3I illustrate" with -- 3A through 3I illustrate --.

Column 18, claim 37,
Line 8, replace "the method of claim wherein" with -- the method of claim 35 wherein --.

This certificate supersedes Certificate of Correction issued February 19, 2002.

Signed and Sealed this

Twentieth Day of August, 2002

*Attest:*

JAMES E. ROGAN
*Attesting Officer*     Director of the United States Patent and Trademark Office